US007962874B2

(12) United States Patent
Foreman et al.

(10) Patent No.: US 7,962,874 B2
(45) Date of Patent: *Jun. 14, 2011

(54) METHOD AND SYSTEM FOR EVALUATING TIMING IN AN INTEGRATED CIRCUIT

(75) Inventors: Eric A. Foreman, Fairfax, VT (US); Peter A. Habitz, Hinesburg, VT (US); David J. Hathaway, Underhill, VT (US); Jerry D. Hayes, Milton, VT (US); Anthony D. Polson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 350 days.

This patent is subject to a terminal disclaimer.

(21) Appl. No.: 12/183,549

(22) Filed: Jul. 31, 2008

(65) Prior Publication Data

US 2008/0313590 A1 Dec. 18, 2008

Related U.S. Application Data

(63) Continuation of application No. 11/383,353, filed on May 15, 2006, now Pat. No. 7,444,608, which is a continuation of application No. 10/709,361, filed on Apr. 29, 2004, now Pat. No. 7,089,143.

(51) Int. Cl.
*G06F 17/50* (2006.01)
(52) U.S. Cl. .......................... 716/113; 703/16
(58) Field of Classification Search .............. 716/6, 113; 703/16

See application file for complete search history.

(56) References Cited

U.S. PATENT DOCUMENTS

| | | |
|---|---|---|
| 5,426,591 A | 6/1995 | Ginetti et al. |
| 5,508,937 A | 4/1996 | Abato et al. |
| 5,636,372 A | 6/1997 | Hathaway et al. |
| 5,654,898 A | 8/1997 | Roetcisoender et al. |
| 5,726,902 A | 3/1998 | Mahmood et al. |
| 5,764,525 A | 6/1998 | Mahmood et al. |
| 5,944,834 A | 8/1999 | Hathaway |
| 6,141,632 A | 10/2000 | Smith et al. |
| 6,148,434 A | 11/2000 | Nozuyama |
| 6,237,127 B1 | 5/2001 | Craven et al. |
| 6,240,542 B1 | 5/2001 | Kapue |
| 6,253,359 B1 | 6/2001 | Cano et al. |
| 6,442,741 B1 | 8/2002 | Schultz |
| 6,536,024 B1 | 3/2003 | Hathaway |
| 6,553,550 B1 | 4/2003 | Menegay et al. |
| 6,615,395 B1 | 9/2003 | Hathaway et al. |
| 6,658,635 B1 | 12/2003 | Tanimoto |

(Continued)

OTHER PUBLICATIONS

Aseem Agarwal, et al., "Statistical Timing Analysis for Intra-Die Process Variations with Spatial Correlations," ICCAD '03, Nov. 11-13, 2003, pp. 621-625.

(Continued)

*Primary Examiner* — Phallaka Kik
(74) *Attorney, Agent, or Firm* — Richard Kotulak; Roberts Mlotkowski Safren & Cole, P.C.

(57) ABSTRACT

Methods for analyzing the timing in integrated circuits and for reducing the pessimism in timing slack calculations in static timing analysis (STA). The methods involve grouping and canceling the delay contributions of elements having similar delays in early and late circuit paths. An adjusted timing slack is calculated using the delay contributions of elements having dissimilar delays. In some embodiments, the delay contributions of elements having dissimilar delays are root sum squared. Embodiments of the invention provide methods for reducing the pessimism due to both cell-based and wire-dependent delays. The delays considered in embodiments of the invention may include delays due to the location of elements in a path.

2 Claims, 8 Drawing Sheets

U.S. PATENT DOCUMENTS

| | | | |
|---|---|---|---|
| 6,745,376 | B2 | 6/2004 | Fredrickson |
| 6,772,402 | B2 | 8/2004 | Mortensen |
| 6,789,223 | B2 | 9/2004 | Fetherson |
| 6,791,343 | B2 | 9/2004 | Ramarao et al. |
| 6,799,308 | B2 | 9/2004 | You et al. |
| 6,807,509 | B2 | 10/2004 | Bourdin et al. |
| 6,886,152 | B1 | 4/2005 | Kong |
| 6,910,194 | B2 | 6/2005 | Mielke et al. |
| 6,912,665 | B2 | 6/2005 | Ellis et al. |
| 6,940,293 | B2 | 9/2005 | Ramarao et al. |
| 7,089,143 | B2 | 8/2006 | Foreman et al. |
| 7,117,466 | B2 | 10/2006 | Kalafala et al. |
| 7,219,320 | B2 | 5/2007 | Kawano et al. |
| 7,353,477 | B2 | 4/2008 | Hathaway et al. |
| 7,356,451 | B2 | 4/2008 | Moon et al. |
| 7,444,608 | B2 | 10/2008 | Foreman et al. |
| 2003/0084418 | A1 | 5/2003 | Regan |
| 2005/0066297 | A1 | 3/2005 | Kalafala et al. |
| 2005/0081171 | A1 | 4/2005 | Kawano et al. |

OTHER PUBLICATIONS

Hongliang Chang, et al., "Statistical Timing Analysis Considering Spatial Correlations Using a Single Pert-Like Traversal," ICCAD '03, Nov. 11-13, 2003, pp. 900-907.

Michael Orshansky, et al., "Impact of Spatial Intrachip Gate Length Variability on the Performance of High-Speed Digital Circuits," IBEE Transactions on Computer-Aided Design of Integrated Circuits and Systems, vol. 21, No. 5, May 2002, pp. 544-553.

Orshanksy et al., "A Generalistic Probabilistic Framework for Worst Case Timing Analysis," DAC 2002, pp. 556-561.

Devgan et al., "Block Based Statis Timing Analysis with Uncertainty," ICCAD 2003, pp. 607-614.

McGeer et al., "Timing Analysis and delay-Fault Test Generation Using Path-Recursive Functions," 1991 IEEE, pp. 180-183.

Blaauw et al., "Slope Propagation in Static Timing Analysis," Oct. 2002, IEEE Transactions on Computer-Aided Design of Integrated Circuits and Systems, vol. 21, No. 10, pp. 1180-1195.

METHOD AND SYSTEM FOR EVALUATING TIMING IN AN INTEGRATED CIRCUIT

CROSS REFERENCE TO RELATED APPLICATIONS

This application is a continuation of U.S. application Ser. No. 11/383,353 filed on May 15, 2006, now U.S. Pat. No. 7,444,608, which is a continuation of U.S. application Ser. No. 10/709,361, filed on Apr. 29, 2004, now U.S. Pat. No. 7,089,143, the contents of which are incorporated by reference in their entirety herein.

BACKGROUND OF THE INVENTION

1. Field of the Invention

The invention relates to methods for evaluating timing in integrated circuits and more particularly to methods and systems for evaluating timing of signals.

2. Background Description

In circuit design, one signal may need to arrive at a particular point in a circuit path before another signal. For example, a signal representing a stable data value may need to arrive at a memory element (e.g., a flip-flop or latch) before the clock signal that stores the value in the memory element. Alternatively, a signal representing a change in a data value may need to arrive at a memory element after the clock signal that stored the last data value. Two paths along which signals propagate so as to arrive at a particular pair of points (e.g., clock and data pins of a flip-flop) in a defined relationship with one another, as in the examples above, are often referred to as racing paths. Each set of racing paths typically includes an early path and a late path. The comparison of a pair of early and late mode signals to determine whether a particular requirement on their relative arrival times is called a timing test. An early mode signal or arrival time is the earliest time at which the value on a net or at a point can change from its previous cycle stable value, and a late mode signal or arrival time is the latest time at which the value on a net or at a point can settle to its final stable value for the current cycle.

Static timing analysis (STA) is a tool used for verification of circuit design and analysis of circuit performance. STA uses delay models to evaluate the delay in circuit paths. Most delay models used for STA can be made to employ parameter distributions, for example, one parameter being gate length, to define best and worst possible integrated circuit performance. The delay models are offered for all process extremes, so the timer can bound delay variations caused by process variations during integrated circuit manufacture, as well as other factors. These process variations can include variations among different integrated circuits, as well as local variations within the same integrated circuit.

In traditional methods of designing application specific integrated circuits (ASICs) and other integrated circuits, the design engineer considers the best-case and worst-case scenarios, for example, by considering and analyzing values for each parameter that are three standard deviations above the mean expected value and three standard deviations below the mean expected value. In other words, both a "fast chip" and a "slow chip" timing analysis are performed. Some manufacturers also use the method of linear combination of delays (LCD) to combine the fast and slow performances to account for variation across the integrated circuit or chip. The LCD method applies different delays to different racing paths, creating an off-tracking margin expressed as a percentage of the delay variation. The off-tracking margin provided by the LCD method is used to account for across-chip variation.

However, since there are a great number of parameters involved in an integrated circuit's timing, the "fast," "slow," and LCD methods described above may not account sufficiently for all of the possible variation, since use of LCD parameters sufficient to account for all possible delay variation due to all possible across-chip variation of all parameters on which delays depend would be excessively pessimistic, and LCD parameters are therefore typically chosen to account for most but not all of the possible delay variation which could occur when all or most of the parameters are at their extreme values. Two racing paths that include different cells or elements and different wires will show different sensitivities to global manufacturing process variations, which means that considering all of the parameters at their fastest and all of the parameters at their slowest may be unrealistic. In a comprehensive timing analysis, a design engineer might consider every possible assignment of parameter values to elements in the racing paths. However, such an analysis might be time consuming and impractical.

SUMMARY OF THE INVENTION

One aspect of the invention relates to a method of analyzing timing in an integrated circuit. The method comprises identifying at least one set of racing paths within the integrated circuit, the at least one set of racing paths including an early path and a late path. The method further comprises identifying at least one delay characteristic of one or more elements in the early path and at least one delay characteristic of one or more elements in the late path and grouping ones of the one or more elements in the early path with ones of the one or more elements in the late path having similar delay characteristics. Additionally, the method comprises deriving an adjusted timing slack for the at least one set of racing paths by at least partially canceling delay contributions from grouped elements having similar delay characteristics.

Another aspect of the invention relates to a method of analyzing timing of an integrated circuit. The method comprises tracing at least one set of racing paths and collecting delay contributions along the set of racing paths. The method further comprises sorting the delay contributions into groups with similar delay contributions and groups with dissimilar delay contributions. Additionally, the method comprises canceling the delay contributions of the groups with similar delay contributions and comparing the delay contributions of the groups with dissimilar delay contributions with an initial timing slack calculated for the set of racing paths.

A further aspect of the invention relates to a method of analyzing timing of an integrated circuit. The method comprises identifying a late path to a timing test and an early path to a timing test and determining by using location information at least one pair of one element from the late path and one element from the early path. The method also comprises computing by using the location information a variation in the difference of delays of the elements of the at least one pair and deriving from the variation a slack for the late path to the timing test and the early path to the timing test.

Other aspects of the invention relate to computer-readable media containing instructions that, when executed, cause a computer to perform the methods described above.

BRIEF DESCRIPTION OF THE DRAWINGS

The invention will be described with respect to the following drawing figures, in which like numerals represent like features throughout the figures, and in which.

DETAILED DESCRIPTION OF EMBODIMENTS OF THE INVENTION

Embodiments of the invention provide methods for evaluating the delay in racing paths of an integrated circuit by using STA techniques (i.e., cell-based delay) and by evaluating the delays due to effects caused by multiple metallization layers in the integrated circuit (i.e., wire-dependent delay). The results may provide a circuit designer with a more realistic estimate of the off-tracking or slack to be expected, as well as a better understanding of how process variations affect off-tracking or slack. Methods according to the invention may be used to diagnose timing problems in existing circuits and to locate timing errors, or to design new integrated circuits. Methods according to the invention may be implemented as part of a system that includes a computer-readable medium having appropriate executable program instructions.

Figure 1:
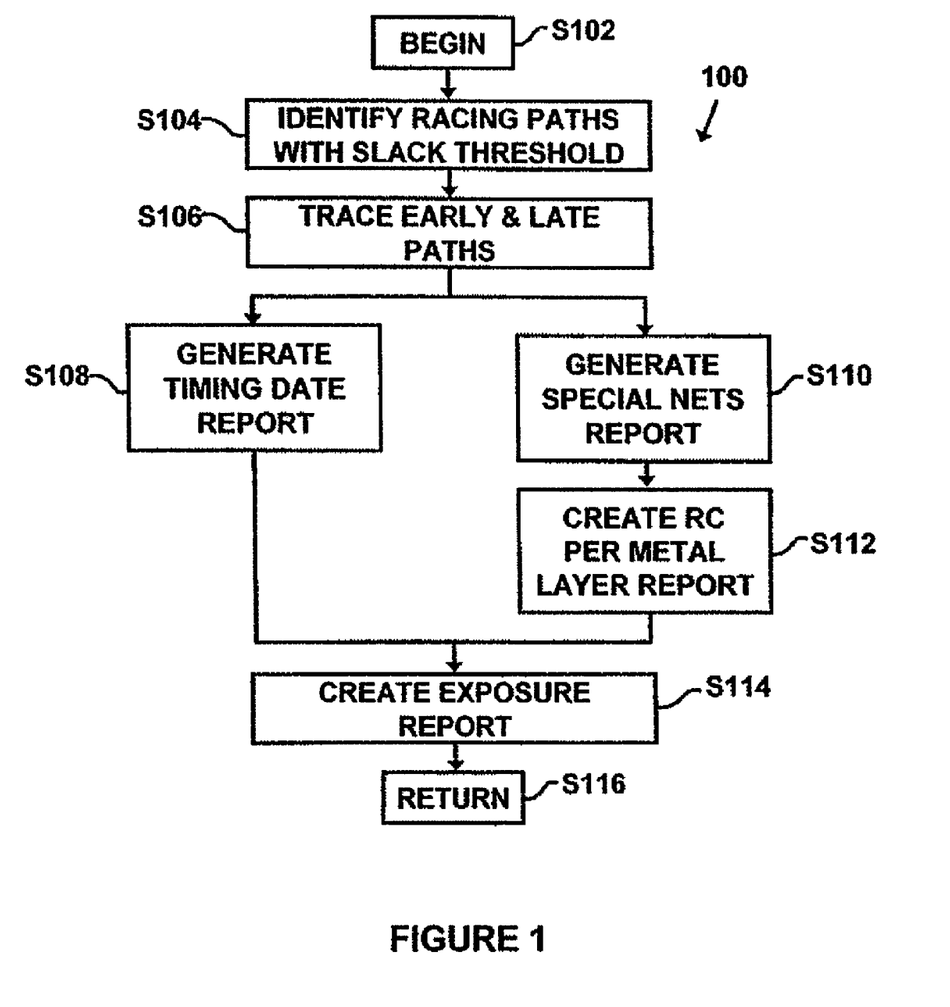
FIG. 1 is a flow diagram of a method according to an embodiment of the invention.

FIG. 1 is a block diagram illustrating the tasks of a method 100 according an embodiment of the invention. Method 100 may be performed in a number of ways. In one embodiment, for example, method 100 may be performed, at least in part, with an STA tool, such as EinsTimer (International Business Machines Corporation, Armonk, N.Y.) and a parasitic extraction tool such as ChipEdit (International Business Machines Corporation, Armonk, N.Y.). In other embodiments, some or all of the tasks of method 100 may be encoded with a scripting language, such as Tcl, a compiled language, such as FORTRAN, C, C++, or Java, or any other suitable programming language, including macros and macro languages. Method 100, and other methods according to embodiments of the invention, may be executed on a general purpose computer, a special purpose computer, a microprocessor, an ASIC, other circuit systems adequately timed with an STA tool, or any other computing device having sufficient capabilities to perform the tasks.

Method 100 begins at S102 and continues with S104. In S104, racing paths within an integrated circuit that have a particular timing slack threshold are identified. Once the racing paths have been identified at S104, control passes to S106, in which the signals for the early and late paths that comprise each set of racing paths are traced to identify the circuits and interconnects within the path between launch and capture of the data and the originating merge point of the launch and capture latches.

Once S106 is complete, two reports are generated, a timing data report, as shown in S108, and a special nets report, as shown in S110. Although illustrated as being performed in parallel, S108 and S110 may be performed sequentially in any sequence, if desired. Once S110 is complete, method 100 continues with S112, in which an RC report containing information on interactions between metallization layers in the integrated circuit for each of the nets identified in S110 would be generated. Once the data from S108, S110, and S112 is available, method 100 continues with S114, in which an exposure report is generated. The exposure report contains information on the timing slack for each identified set of racing paths and adjustments that may be made to the timing slack. These reports will be described below in more detail. Once S114 is complete, method 100 terminates at S116.

The results of methods according to the invention, including method 100, may be presented in any way that is convenient for the user or that facilitates good integrated circuit design practices. For example, the report of S114 may be presented graphically, by highlighting the racing paths and displaying the relevant data on or adjacent to a diagram of the integrated circuit or of appropriate layers of the integrated circuit.

Figure 2:
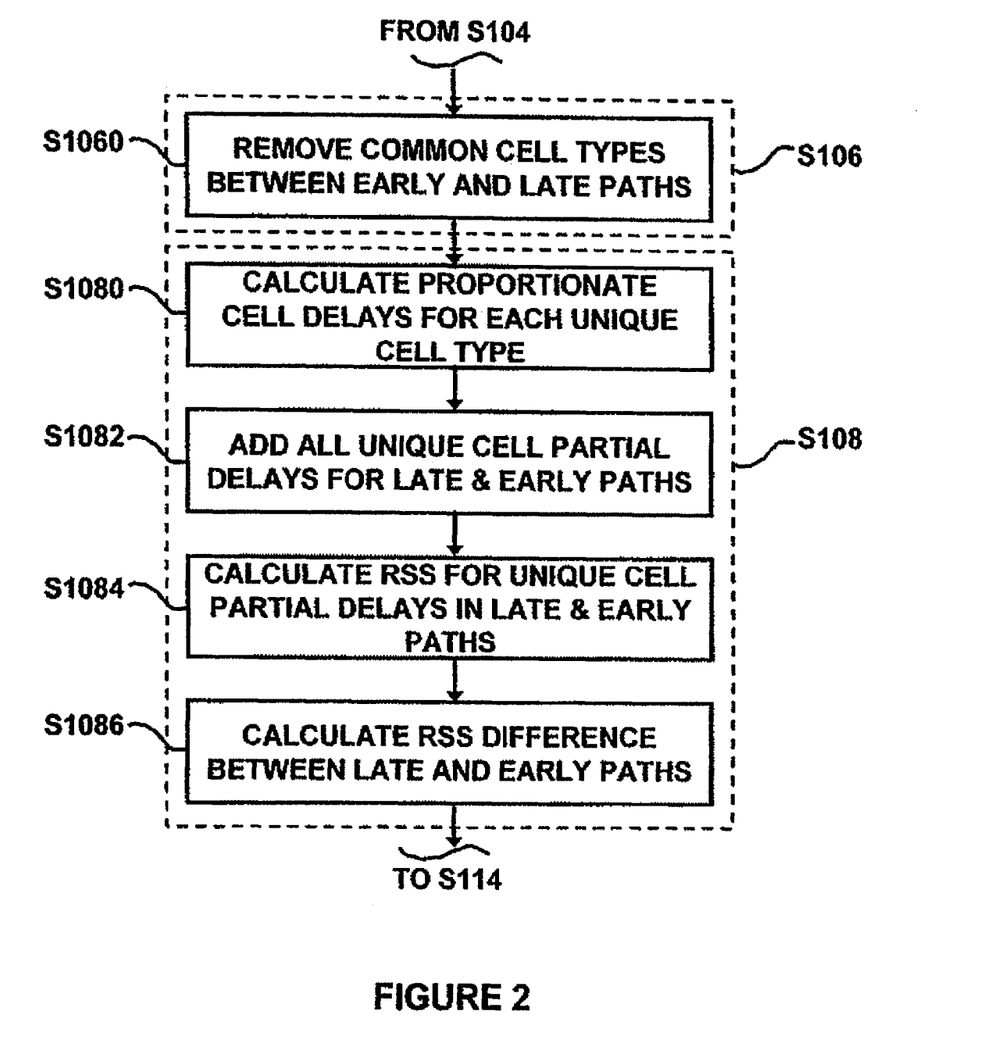
FIG. 2 is a flow diagram illustrating certain sub-tasks of the method of FIG. 1.

As may be appreciated by those skilled in the art, a number of tasks are performed in order to generate the reports in S108, S110 and S112 that were described above. FIG. 2 is a schematic flow diagram of certain sub-tasks involved in S106 and S108 of method 100. The first task shown in FIG. 2, S1060, a sub-task of S106, is to remove or cancel the partial delays caused by similar cell types in the early and late paths of the set of racing paths. The partial delay is some percentage of the total delay for each cell. In effect, the partial delay is a delay tolerance that would be set for each cell or element based on the properties of the individual cell or element. Even identical cells in two racing paths may have different loadings, input slews, or other instance-specific characteristics which would cause their partial delays not to be identical. Therefore, this cancellation of partial delays may not be complete, and may leave some small difference to be included in the delay of the path which had the larger delay for its instance of the similar cell. Methods of dealing with these uncanceled residual partial delays will be described below in more detail.

Figure 3A:
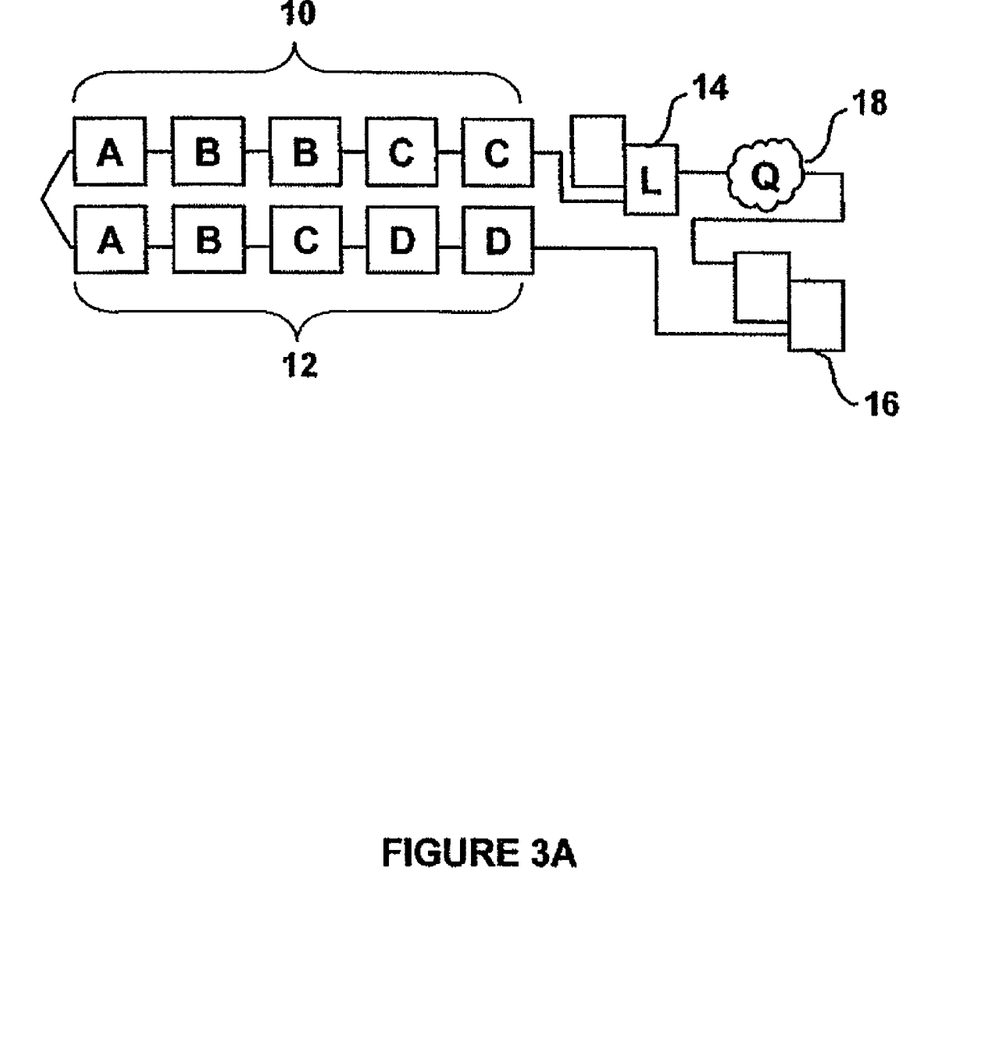
FIG. 3A is a schematic diagram of a typical set of racing paths.
Figure 3B:
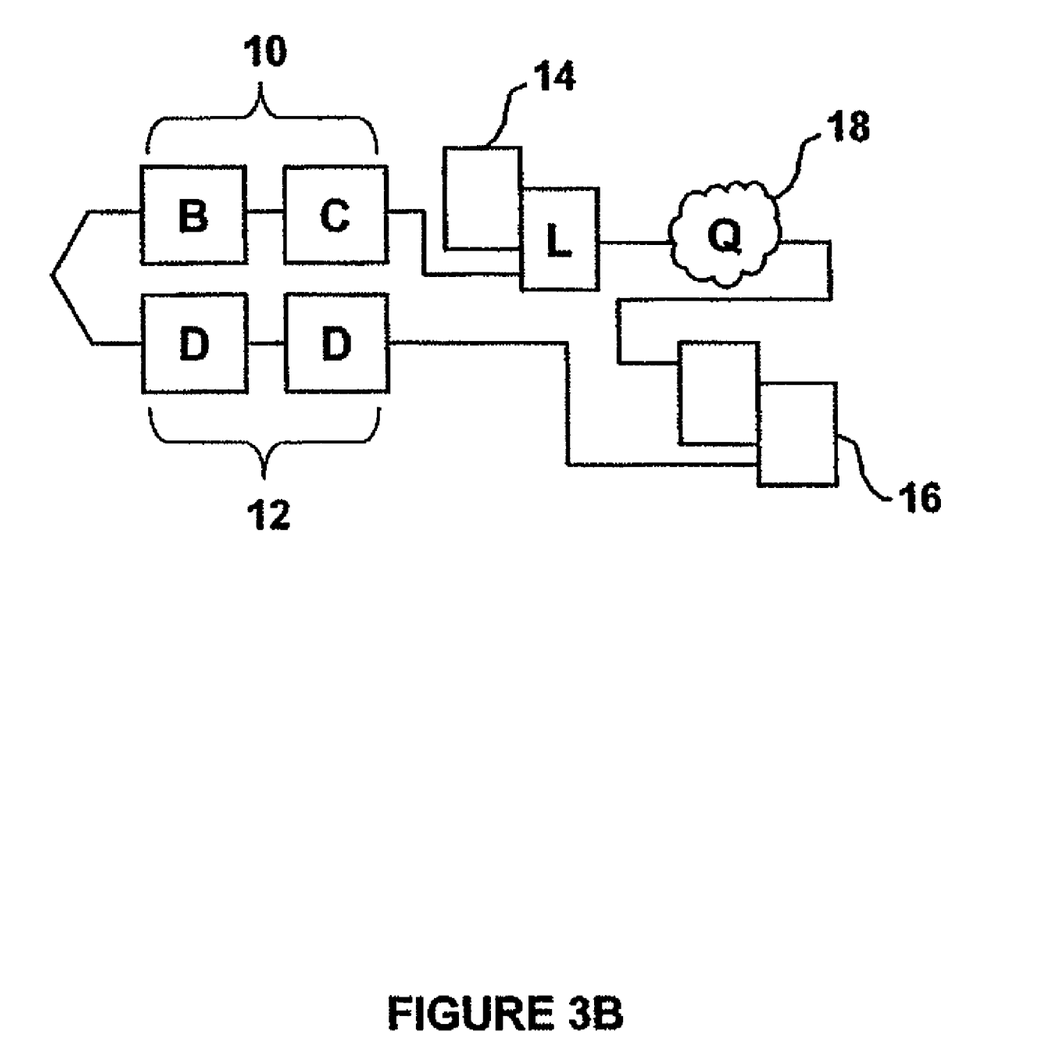
FIG. 3B is a schematic diagram of the racing paths of FIG. 3A with cells of similar delay common to the racing paths eliminated.

FIGS. 3A and 3B are schematic diagrams of a typical set of racing paths, and illustrate the concept of removing or canceling partial delays caused by similar cell types in the early and late paths. The set of racing paths in FIG. 3A includes an early path 10, a late path 12, a launch latch 14, a capture latch 16, and some cell delay, shown generally as 18, between the launch and capture latches 14, 16. Each of the early 10 and late 12 paths comprises a number of individual cells A, B, C, D. Cells with the same label in FIG. 3A are assumed to have similar delays or track well with any parameter variation. Cells with similar delays may or may not be identical; for example, inverters of two different power levels might be considered similar for partial delay cancellation purposes. In general, similarity between two cell types would be established by examining the statistical correlation between the delays for both types of cells. In this example, cells of the same type A B, C, D, are assumed to have perfect statistical delay correlation (e.g., two cells of type A are assumed to have perfect statistical delay correlation).

In some embodiments, the cells may be collected in groups of similarly behaving cells before the analysis tasks of methods according to embodiments of the invention are performed. This may simplify and speed up the analysis. In other embodiments, the physical area of the integrated circuit may be divided into regions, and only cells which are both similarly behaving and in the same region would be considered similar.

If two racing paths are known to be dissimilar in cell types, or if particular segments of the racing paths are known to be dissimilar, the search for and identification of similar cells may be carried out on portions of the paths, rather than the entirety of the paths. For example, the identification of similar cells within paths may be restricted to the clock portions of the early and late racing paths, as these are more typically comprised of similar cells. In particular, a setup test generally is between an early path comprising clock elements and a late path comprising both clock and data elements, and a hold test generally is between a late path comprising clock elements and an early path comprising both clock and data elements. Therefore, in both of these usual cases, only one of the racing paths comprises data elements, and, thus, such elements are unlikely to be matched to similar elements in the other path.

Taking the early and late paths 10, 12 of FIG. 3A as an example, in S1060, cells of similar delays that are common to both the early and late paths 10, 12 would be eliminated from further partial delay calculations, because those cells will not contribute to any relative delay between the early and late paths 10, 12. For example, in the early path 10, there is one cell A, and in the late path 12, there is one cell A. Because one cell A exists in each of the early and late paths 10, 12, the partial delay of cell A will not contribute to any relative partial delay between the early and late paths 10, 12. Therefore, cell A is eliminated from consideration in both the early path 10 and the late path 12.

There are two occurrences of cell B in the early path 10 and one occurrence of cell B in the late path 12; therefore, only one cell B (i.e., in the early path 10) will contribute to the relative partial delay between the early and late paths 10, 12, and the other occurrences of cell B are eliminated from consideration. The situation is the same with cell C; all but one occurrence of cell C can be eliminated, because only the occurrence of cell C (i.e., in the early path 10) will contribute to the relative partial delay between the early and late paths 10, 12. However, there are two occurrences of cell D in the late path 12 and no occurrences of cell D in the early path 10; therefore, both occurrences of cell D in the late path 12 are considered, because both will contribute to the relative partial delay between the early and late paths 10, 12.

FIG. 3B illustrates the early and late paths 10, 12 of FIG. 3A once the partial delay effects of similar cells A, B, C, D have been canceled and removed from the partial delay calculations. As shown, the early path 10 includes one occurrence of cell B and one occurrence of cell C; the late path 12 includes two occurrences of cell D.

Once partial delay effects of similar cells have been removed from the calculations, as was described above, method 100 continues with S108. Certain sub-tasks of S108 are shown in FIG. 2. In general, S108 and other tasks of method 100 provide adjustments for the pessimistic worst-case timing scenarios that are typically used by design engineers. The first sub-task of S108 shown in FIG. 2, indicated by reference numeral S1080, is to calculate proportionate cell partial delays for each remaining unique cell type. Following that, in S1082, all unique cell type partial delays are added together for the early path 10 and all unique cell type partial delays are added together for the late path 12. In S1084, the square root of the sum of squared unique cell type partial delays (i.e., the root sum square (RSS) of the unique cell type partial delays) is calculated for the early path 10 and, separately, for the late path 12. In S1086, the RSS difference between the early and late paths 10, 12 is calculated. These sub-tasks will be explained in greater detail below.

In general, once the early and late paths 10, 12 are reduced, as in S1060, the individual partial delays of the remaining cells are summed. If the cells in the path are dissimilar (i.e., have statistically independent delays), the total of the partial delays (i.e., sigma for the combined delay function) is established by RSS. If the cells in the path are similar and their delays are statistically correlated, the total of the partial delays will simply be the sum of the sigmas for the individual delay functions.

The sub-tasks S1080-S1086 are best illustrated by an example. The equations for calculating the combined partial delays are:

$$A_t = A_l + A_c \quad (1)$$

$$A_{l,c} = [[(\text{number of cells}_i)(\text{partial delay}_i)]^2 + [(\text{number of cells}_j)(\text{partial delay}_j)]^2 + \ldots]^{0.5} \quad (2)$$

In equation (1), $A_t$ is the total delay adjustment, $A_l$ is the total launch delay adjustment for one of the racing paths, and $A_c$ is the total capture delay adjustment for the other racing path. Equation (2) is the equation for the RSS calculation. As stated in equation (2), the delay adjustment for either the launch or capture clock path ($A_l$ or $A_c$) is the root sum square of the partial delay for each type of cell multiplied by the number of cells of each type. As stated previously, delays or partial delays for the same type of cell may not be identical, in which case the product of the number of cells of a given type and the partial delay of a cell of that type would be replaced by the sum of instance-specific partial delays of all of the cells of the given type. Also, if the partial delay cancellation in step S1060 was not complete, the remaining partial delay for the cell type within the launch or capture path would be squared and included in the RSS computation.

Given the reduced pathway shown in FIG. 3B, with equations (1) and (2) above, assuming, for the sake of example, that all of the cells have equal delays of 50 ps, and that the partial delay is 5% of the cell delay, the total delay adjustment $A_t$ is calculated as follows:

For the launch or early path 10:

$$A_l = [[(1)(2.5)]^2 + [(1)(2.5)]^2 + [(1)(2.5)]^2 + [(1)(2.5)]^2]^{0.5} = 5 \text{ ps}$$

For the capture or late path 12:

$$A_c = [(2)(2.5)^2]^{0.5} = 3.5 \text{ ps}$$

Therefore, $A_t = 8.5$ ps

Those of skill in the art will note that the delay adjustment calculation for the launch or early path includes terms for both the launch latch 14 and the cell delay 18. The value of $A_t$ calculated with equation (1) is the desired result of S1088. Once the value of $A_t$ is established in S1086, the tasks of S108 of method 100 are complete. As shown in FIG. 2, the results of S108 are passed to S114.

Figure 4:
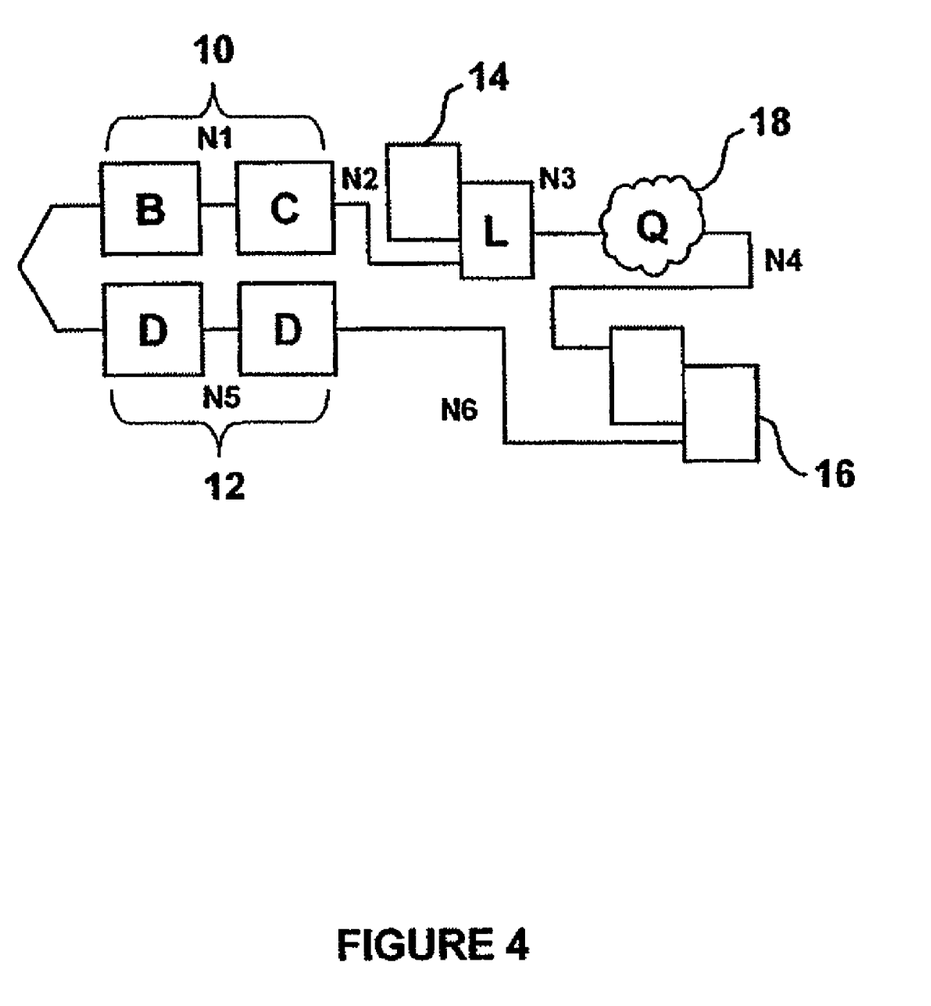
FIG. 4 is a schematic diagram similar to FIG. 3B, illustrating the nets present in the racing paths.

As was illustrated in FIG. 1 and explained briefly above, in addition to generating a timing data report, other tasks of methods according to the invention involve taking into account resistances and capacitances of the interconnects in the paths, especially as caused by the various individual metallization layers in the integrated circuit. Task S110 of method 100 begins the process of considering the resistances and capacitances by identifying the various nets in the early and late paths 10, 12, using the reduced paths generated in S1060. FIG. 4 is a schematic diagram of the reduced early and late paths 10, 12 of FIG. 3B, illustrating the six nets, indicated by N1-N6, and their locations.

After S110, method 100 continues with S112, in which an RC per metal layer report is created to account for resistances and capacitances in the paths due to the different metallization layers. In general, three delay-related parameters tend to vary between metallization layers in an integrated circuit: source slew, sink slew, and wire delay. Source slew is a measure of how fast a signal rises or falls at the output of a source cell or element. Sink slew is a measure of how fast a signal rises or falls at the input of a sink cell or element. Wire delay is a measure of delays caused by individual wires, and is the difference between the time a signal rises or falls at the output of a source cell or element and the time it rises or falls at the input of a sink cell or element.

Any change in the metallization due to process variations, for example, a variation of one wire level toward a faster process condition, may change the resistance and the capacitance of the interconnect and may impact all three values. In general, the source slew changes in response to a change of the capacitance load, the wire delay changes in response to a change of the resistance-capacitance (RC) product, and the sink slew changes in response to both the source slew change and the interconnect RC. In methods according to embodiments of the invention, the timing tool or system accumulates cell and wire delays. Any slew change is connected with a change of the cell delay; both source and sink cell delay change. Methods of calculating these delay changes will be described below.

Figure 5:
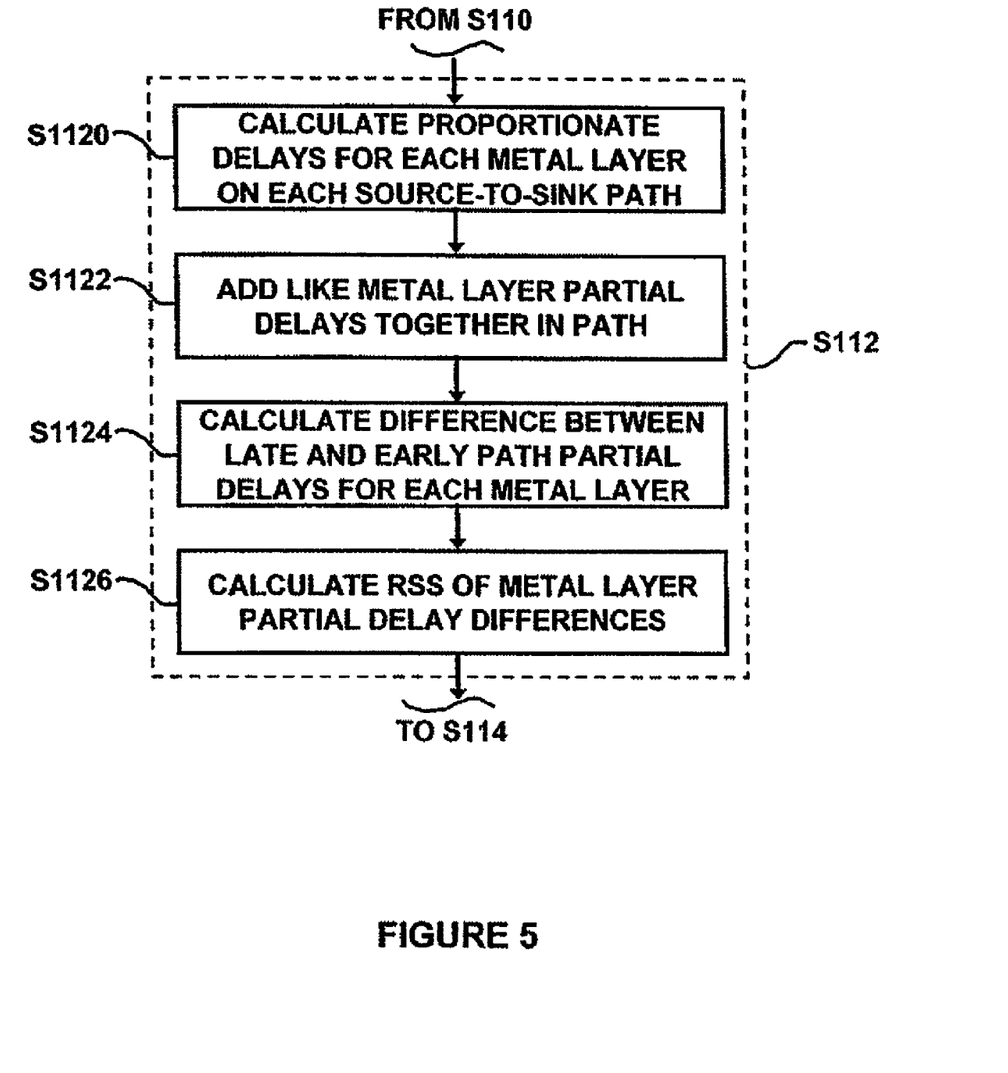
FIG. 5 is a schematic flow diagram illustrating certain sub-tasks of the method of FIG. 1.

Step S112, the task of generating the RC report, includes several sub-tasks, which are shown in the schematic flow diagram of FIG. 5. It will be understood that the metal layer partial delays referred to in these tasks are portions of the total variations of each delay attributable to variations in the corresponding metal layer. The sub-tasks illustrated in FIG. 5 begin when method 100 continues from S108 into S112. The first sub-task of S112, S1120, is to calculate proportionate partial delays for each metal layer on each source-to-sink path. Following S1120, in S1122, like metal layer partial delays are added together. After S1122, in S1124, the difference between late and early path partial delay sums for each metal layer is calculated. After S1124, in S1126, the RSS of metal layer difference partial delays is calculated.

The sub-tasks S1120-S1126 are best illustrated by an example. In S1120, the proportionate RC partial delays are calculated by taking derivatives of various quantities with respect to a change in a given metallization layer x to determine the variation in the quantity for the expected variation in the metallization layer. Various well-known means for estimating the derivatives of these quantities with respect to variations in each metal layer may be used, including analytic differentiation of an analytic delay model, or finite differencing. The derivatives will be computed in this example using the following equations, in which $R_{up}$ refers to the total resistance along the path from the net source to the wire segment of interest, and $C_{down}$ refers to the total capacitance for which the path to the net source passes through the wire segment of interest:

$$\text{Adjust}(M_x)_{L,E} = \text{SourceAdjust}(M_x)_{L,E} + \text{WireAdjust}(M_x)_{L,E} + \text{SinkAdjust}(M_x)_{L,E} \quad (3)$$

$$\text{SourceAdjust}(M_x)_{L,E} = \left(\frac{1}{2}\right)(\text{SourceSlew})\sum_x \left(\frac{\Delta C(M_x)_{L,E}}{C_{\text{metal\_load}}}\right) \quad (4)$$

$$\text{WireAdjust}(M_x)_{L,E} = (\text{WireDelay})\frac{\left[\sum_x \begin{pmatrix} R_{up} \times \Delta C(M_x)_{L,E} + \\ C_{down} \times \Delta R(M_x)_{L,E} \end{pmatrix}\right]}{RC_{\text{interconnect}}} \quad (5)$$

$$\text{SinkAdjust}(M_x)_{L,E} = \left(\frac{1}{2}\right)\left(\frac{\text{SinkCellDelay}}{\text{SinkSlew}}\right)\sum_x \begin{pmatrix} R_{up} \times \Delta C(M_x)_{L,E} + \\ C_{down} \times \Delta R(M_x)_{L,E} \end{pmatrix} \quad (6)$$

In general, Equations (3)-(6) help to establish the sensitivity of the delay to a change of capacitance (cap) in one metal layer. The summation on the right side of Equation (4) calculates the fractional change in the total capacitance of the net by dividing DeltaC($M_x$) (i.e., the change in capacitance for wire segments of a particular metallization level x within the net) by the total net capacitance. The result is multiplied with ½ of the source slew to account for how much the midpoint of the source timing point will move with load. The final result is the change of source slew with a process change of metallization level $M_x$.

Equation (5) gives the wire delay change for a given source sink pair with a change of the process on the level $M_x$. The expression in the right side numerator contains the derivative of the RC delay product to changes of a single level, computed using the Elmore delay wire delay model, which is well known to those of skill in the art. Other wire delay models such as order reduction methods could also be used. The denominator $RC_{interconnect}$ is the total RC delay of the source sink pair. Multiplying this quotient by the actual wire delay, which may be computed using a more accurate model (e.g., an order reduction method) than Elmore model used for derivative computation, gives delay sensitivity including the first order effects of resistive screening of wires.

Equation (6) describes how a change of a single wire level $M_x$ impacts the sink cell delay. Under most environmental conditions, it has been found empirically that the cell delay changes with ½ of the change in the source slew. That may not always be the case but is a good approximation in most cases; therefore, that approximation appears in Equation (6). A further simplifying assumption is made by assuming that the change in the sink slew is equal to the change in the Elmore wire delay RC.

As stated in Equation (3), the total adjustment for each metal level ($M_x$) in the late and early paths is the sum of the source adjustment, the wire adjustment and the sink adjustment. The terms "SinkCellDelay," "SinkSlew," "WireDelay," and "SourceSlew" in Equations (4)-(6) represent parameters that may be established for each path under consideration by one of skill in the art. As those of skill in the art will note, in general, Equations (4)-(6) define the various adjustments as functions of a path parameter (i.e., "SinkCellDelay," "SinkSlew," "WireDelay," and "SourceSlew") multiplied by the change in R or C for a particular metallization layer.

Once Equation (3) is applied to the late path and the early path, the difference between the late and early paths is determined for each metal layer, as shown in S1124 of FIG. 5, to create a total adjustment for each metallization layer. Following that, the RSS of the delay differences is calculated using Equation (7) below.

$$\text{Adjust}=[\text{Adjust}(M_1)^2+\text{Adjust}(M_2)^2+\ldots]^{0.5} \quad (7)$$

Once the result of Equation (7) is available, S112 is complete and method 100 continues with S114 of FIG. 1. In S114, an exposure report is generated, identifying the timing test or paths, the particular clock or data signals of interest, the original timing slack, the total adjustment (i.e., the additive result of Equations (1) and (7)), and the new timing slack taking into account the adjustment. For example, a report generated in S114 might read as shown in Table 1 below.

TABLE 1

| Test# | CapturePin | Edge | Phase | Original Slack | Adjust | New Slack |
|---|---|---|---|---|---|---|
| 5 | reg_11/D | R | clkL | 0.005 | 0.043 | −0.038 |
| 8 | p_reg/D | R | clk_2@L | 0.015 | 0.042 | −0.027 |

As shown in Table 1, the two paths reported originally had positive timing slacks, indicating a passed timing test when variation was not considered. After appropriate adjustments according to method 100, the new timing slack for both paths is negative, indicating that the timing tests may fail in the presence of variation. The type of report shown in Table 1 and produced by method 100 allows the user to compare the initial and new timing slack for each path in the set of racing paths.

Once a timing report is generated in S114, method 100 completes and returns. However, it should be understood that method 100 may be performed iteratively or repetitively to evaluate the timing in multiple paths or in the same path after changes are made to an integrated circuit. In general, the tasks of method 100 and other methods according to the invention may be used to analyze existing integrated circuits to find and correct timing problems and may also be used to design new integrated circuits. As will be appreciated by those of skill in the art, methods according to embodiments of the invention may also encourage circuit designs that reduce pessimism.

Method 100 includes tasks of grouping similar cells or elements in a path and canceling common or similar delays between the early and late paths. However, other methods of evaluating, grouping, and canceling delays in order to provide adjusted timing information may be used according to embodiments of the invention. In some embodiments, the location of cells or elements within a path, the delays that result from the relative locations along the path, and spatial correlation of two elements in a path, may be taken into account.

Figure 6:
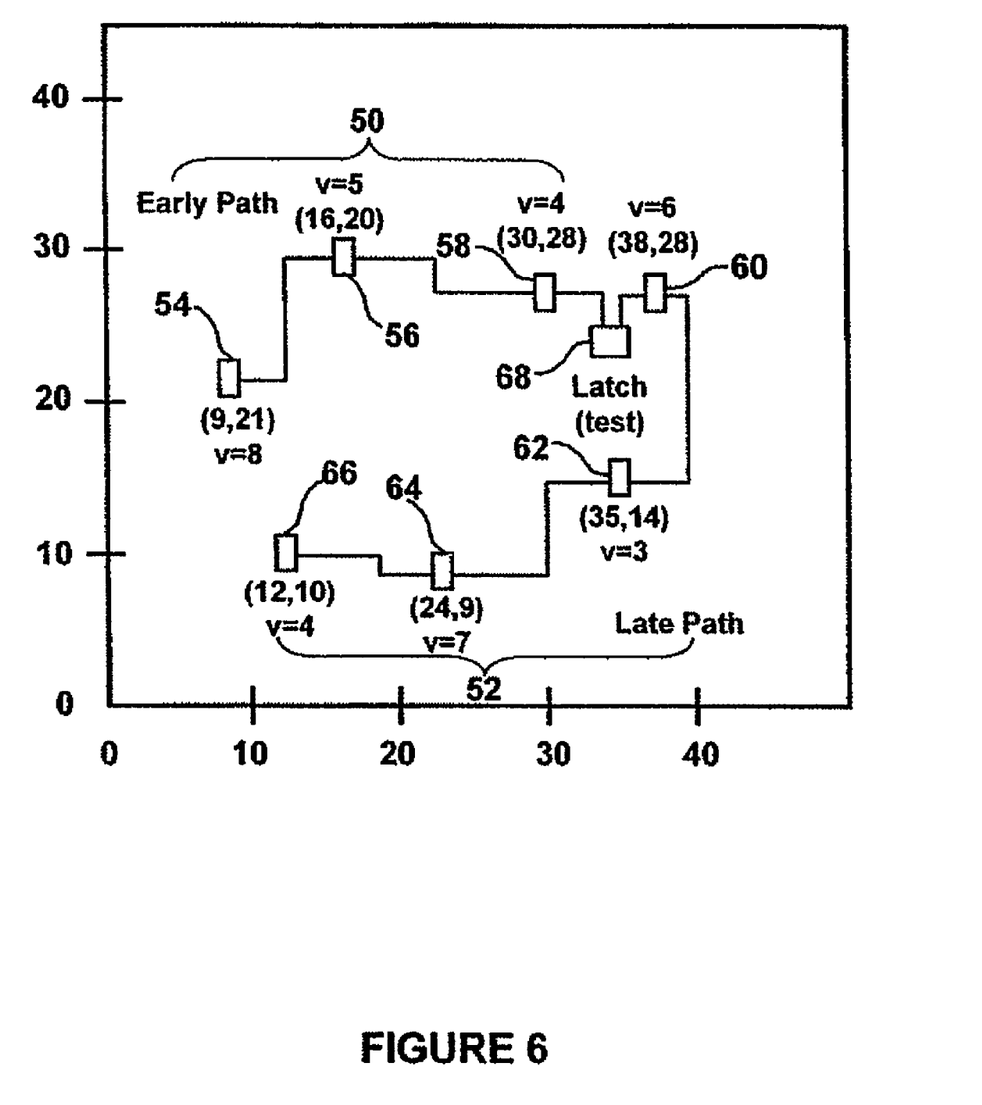
FIG. 6 is a schematic diagram of an early path and a late path, illustrating the varying physical locations of the cells or elements in the paths.

For example, FIG. 6 is a schematic diagram of an early path 50 and a late path 52, laid out on a distance grid for explanatory purposes. Each of the early and late paths 50, 52 has a number of cells or elements 54-66, each element 54-66 having its own location on the integrated circuit and its own delay variation. A test latch 68 is also shown in FIG. 6. In FIG. 6, the location coordinates and delay variation of each cell or element 54-66 are noted beneath the element 54-66. Although FIG. 6 refers to the physical location of elements 54-66 in the integrated circuit, abstract measures of location, based, for example, on statistical correlation of delay functions, may also be used in embodiments of the invention.

In FIG. 6, and in the description that follows, variation numbers refer to the maximum and minimum possible variation of delay for a particular cell or element. For example, "v=5" in FIG. 6 may be interpreted to mean that the delay of a particular cell or element may vary from nominal minus five to nominal plus five. The variation may be viewed as the maximum variation or delta relative to another cell or element located the maximum possible distance away from the cell or element under consideration. The units of delay and distance, in this example, are arbitrary.

Given the above, the delays that result from differences in location of two cells or elements may be calculated using Equation (8). Additionally, for purposes of explanation, distance may be calculated using Equation (9), although other methods of calculating distance may be used. The value max_dist is the maximum possible distance between any two points on the chip according to the distance calculation of Equation (9), which for the example of FIG. 6 would be 100.

$$V_{d1-d2} = |v_1 - v_2| + \frac{dist(d_1, d_2) \times 2(\min(v_1, v_2))}{\max\_dist} \quad (8)$$

$$dist(d_1, d_2) = |x_1, -x_2| + |y_1 - y_2| \quad (9)$$

Using Equation (8), two cells or elements that have the same variation and are at the same location have zero variation in their delay difference, while the difference in delay between two cells or elements at opposite corners of an integrated circuit have a full combined variation of $v_1+v_2$. When the variation of the two cells or elements is very different, only the smaller of the two is used to cancel the other. Therefore, using Equation (8), if two cells or elements are at the same location but one has zero variation, the variation in their difference is still the total variation of the other cell or element. According to embodiments of the invention, the abs($v_1-v_2$) term in Equation (8) may be canceled using the variation in another cell or element, as will be explained below.

Figure 7:
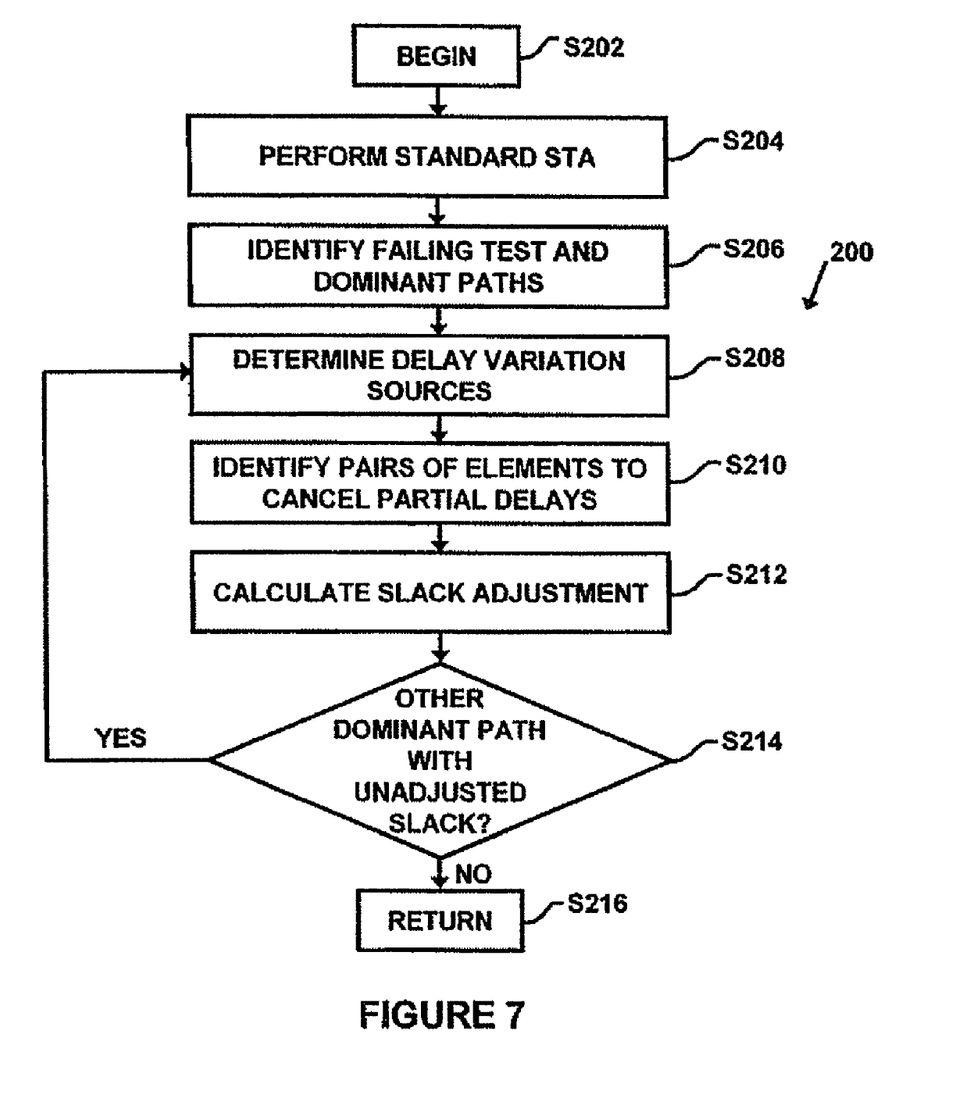
FIG. 7 is a flow diagram of a method according to another embodiment of the invention.

FIG. 7 is a flow diagram of a method 200 according to another embodiment of the invention, which employs some of the location-based methods described above. Method 200 begins at S202 and continues with S204. In S204, a standard STA is performed, and method 200 continues with S206. The standard STA of S204 would typically ignore location-based delays, and would be performed with no variation considered. Alternatively, the standard STA of step 204 could assume the maximum possible variation in each delay, with the variation being added to the late path delays and subtracted from the early path delays, which makes it easier to ensure that all potentially failing paths are subsequently identified in step S206. In this case the slack adjustment would have to be added to the standard STA slack to reduce pessimism, rather than being subtracted from the standard STA slack to account for variation, as is described below. In S206, the results of the STA are analyzed to identify potentially failing timing tests (e.g., slack setup or hold tests with slacks below some threshold value) and the dominant racing paths to the clock and data pins of the test. Once the dominant failing racing paths are identified in S206, method 200 continues with S208, in which the sources of delay are determined.

The tasks of S208 may take into account delay and variation in delay due to the relative locations of elements in the paths, as was described above with respect to FIG. 6. The sources of delay determined in S208 may also include metal layer thickness variations and other delay variations, such as those sources considered in S112 of method 100, which was described above. In general, the tasks of method 200 may be used in combination with the tasks of S110 and S112 that were identified above.

Method 200 continues with S210. Typically, one result of S208 would be data similar to that presented in FIG. 6; therefore the description of S210 that follows will refer to FIG. 6. In S210, pairs of elements, one from the early path 50 and one from the late path 52, are chosen so as to partially cancel delay variations between the early and late paths 50, 52.

For example, cells 58 and 60 have locations of (30, 28) and (38, 28); therefore, their distance (by Equation (9)) is 8. Since cell 58 has a variation of 4 and cell 60 has a variation of 6, their matching portion (min($v_1, v_2$)) is 4 and the residual is 2. The variation in the difference of their matching portion, calculated using Equation (9), is 0.64, which is less than the variation of 8 that would be assumed without taking into account spatial correlation. The residual variation of cell 60 remains available to be canceled with part or all of the variation of another cell in the late path. The matching and canceling of variation between pairs of early and late path cells continues until no residual delay remains for any element in at least one of the paths.

Table 2, below, summarizes the complete matching process of S210.

TABLE 2

| Early Path Element and Location | Late Path Element and Location | Distance | Matching Variation | Residual Variation | Reduced Matching Variation |
|---|---|---|---|---|---|
| 58-(30, 28) | 60-(38, 28) | 8 | 4 | 2 (late) | 0.64 |
| 54-(9, 21) | 66-(12, 10) | 14 | 4 | 4 (early) | 1.12 |
| 56-(16, 30) | 60-(38, 28) | 24 | 2 | 3 (early) | 0.96 |
| 54-(9, 21) | 64-(24, 9) | 27 | 4 | 3 (late) | 2.16 |
| 56-(16, 30) | 64-(24, 9) | 29 | 3 | 0 | 1.74 |
| Total | | | | | 6.62 |

Note that in the example of FIG. 6, the lone unmatched element is element 62, which has a residual (and in this case total) variation of 3. Once the elements 54-66 have been paired, method 200 continues with S210, in which the slack adjustment is calculated. In this case, the slack adjustment is the total reduced matching variation (in this case, the total reduced matching variation shown in Table 1) plus the variation of any unpaired elements (in this case, element 62). Therefore, the total slack adjustment is 9.62, and the timing slack for the paths 50, 52 illustrated in FIG. 6, which would have been calculated to be 37 by adding all of the variations together, is 27.38. This slack adjustment would be subtracted from the slack computed in step S204 using standard STA to account for the effects of variation.

Method 200 continues with S214, a decision task. In S214, if there is another potentially failing path (of the paths identified in S206) with unadjusted slack, method 200 may return to S208 so that the timing slack for that other path can be adjusted as described above. If all of the identified paths have been adjusted, method 200 may terminate at S216.

While the invention has been described with respect to several exemplary embodiments, those of skill in the art will realize that modifications and changes may be made within the scope of the appended claims.

What is claimed is:

1. A non-transitory computer-readable medium containing instructions that, when executed, cause a computer to:
    identify at least one set of racing paths within an integrated circuit, the at least one set of racing paths including an early path and a late path;
    identify at least one delay characteristic of one or more elements in the early path and at least one delay characteristic of one or more elements in the late path;
    group ones of the one or more elements in the early path with ones of the one or more elements in the late path having similar delay characteristics; and
    derive an adjusted timing slack for the at least one set of racing paths by at least partially canceling delay contributions from grouped elements having similar delay characteristics.

2. The computer-readable medium of claim 1, wherein the instructions further cause the computer to, prior to the derive step, generate an exposure report containing information on a timing slack for each identified set of racing paths and adjustments that can be made to the timing slack.

* * * * *